United States Patent
Nelson et al.

(10) Patent No.: US 12,543,329 B2
(45) Date of Patent: *Feb. 3, 2026

(54) HIGH FREQUENCY AND HIGH POWER THIN-FILM COMPONENT

(71) Applicant: KYOCERA AVX Components Corporation, Fountain Inn, SC (US)

(72) Inventors: Cory Nelson, Simpsonville, SC (US); Gheorghe Korony, Myrtle Beach, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/609,003

(22) Filed: Mar. 19, 2024

(65) Prior Publication Data

US 2024/0250113 A1 Jul. 25, 2024

Related U.S. Application Data

(63) Continuation of application No. 16/431,847, filed on Jun. 5, 2019, now Pat. No. 11,967,609.
(Continued)

(51) Int. Cl.
*H01L 23/66* (2006.01)
*H01L 23/367* (2006.01)
(Continued)

(52) U.S. Cl.
CPC ............. *H10D 1/47* (2025.01); *H01L 23/367* (2013.01); *H01L 23/647* (2013.01); *H01L 23/66* (2013.01)

(58) Field of Classification Search
None
See application file for complete search history.

(56) References Cited

U.S. PATENT DOCUMENTS 5,057,908 A 10/1991 Weber
5,481,241 A 1/1996 Caddock, Jr.
(Continued)

FOREIGN PATENT DOCUMENTS

CN 104952567 A 9/2015
JP H 07162177 A 6/1995
(Continued)

OTHER PUBLICATIONS

AVX RF—Ultra-Broadband Resistors, UBR Series, Mar. 28, 2017, 1 page.
(Continued)

*Primary Examiner* — Daniel Whalen
(74) *Attorney, Agent, or Firm* — Dority & Manning, P.A.

(57) ABSTRACT

A surface mount component is disclosed including an electrically insulating beam that is thermally conductive. The electrically insulating beam has a first end and a second end that is opposite the first end. The surface mount component includes a thin-film component formed on the electrically insulating beam adjacent the first end of the electrically insulating beam. A heat sink terminal is formed on the electrically insulating beam adjacent a second end of the electrically insulating beam. In some embodiments, the thin-film component has an area power capacity of greater than about 0.17 W/mm² at about 28 GHz.

17 Claims, 10 Drawing Sheets

Related U.S. Application Data

(60) Provisional application No. 62/681,262, filed on Jun. 6, 2018.

(51) Int. Cl.
*H01L 23/64* (2006.01)
*H10D 1/47* (2025.01)

(56) References Cited

U.S. PATENT DOCUMENTS

| | | | |
|---|---|---|---|
| 7,042,232 B1 | 5/2006 | Jacobs | |
| 7,190,252 B2 | 3/2007 | Smith et al. | |
| 8,665,059 B2 | 3/2014 | Korony et al. | |
| 8,823,483 B2 | 9/2014 | Smith et al. | |
| 8,994,490 B2 | 3/2015 | Davidsson et al. | |
| 9,001,512 B2 | 4/2015 | Smith et al. | |
| 9,502,161 B2 | 11/2016 | Smith et al. | |
| 10,075,107 B2 | 9/2018 | Lepka et al. | |
| 11,967,609 B2 * | 4/2024 | Nelson | H01C 7/003 |
| 2013/0127588 A1* | 5/2013 | Korony | H01C 1/06 |
| | | | 338/314 |
| 2014/0060897 A1* | 3/2014 | Davidsson | H04B 1/00 |
| | | | 174/252 |
| 2015/0245481 A1* | 8/2015 | Brunner | H01C 1/084 |
| | | | 361/760 |

FOREIGN PATENT DOCUMENTS

| | | |
|---|---|---|
| JP | 2003188323 A | 7/2003 |
| JP | 2007019274 A | 1/2007 |
| JP | 2007227719 A | 9/2007 |

OTHER PUBLICATIONS

Smith, Ben, "Technical Information—Energy and Power Handling Capabilities of Thin Film and Ceramic Capacitors," AVX Corporation, 4 pages.

Vishay Dale Thin Film—High Frequency (up to 40 GHz) Resistor, Thin Film Surface Mount Chip, Mar. 5, 2018, 5 pages.

Vishay Sfernice—High Frequency 50 GHz Thin Film Chip Resistor, Feb. 8, 2018, 11 pages.

International Search Report and Written Opinion for PCT/US2019/035549 dated Sep. 24, 2019, 11 pages.

* cited by examiner

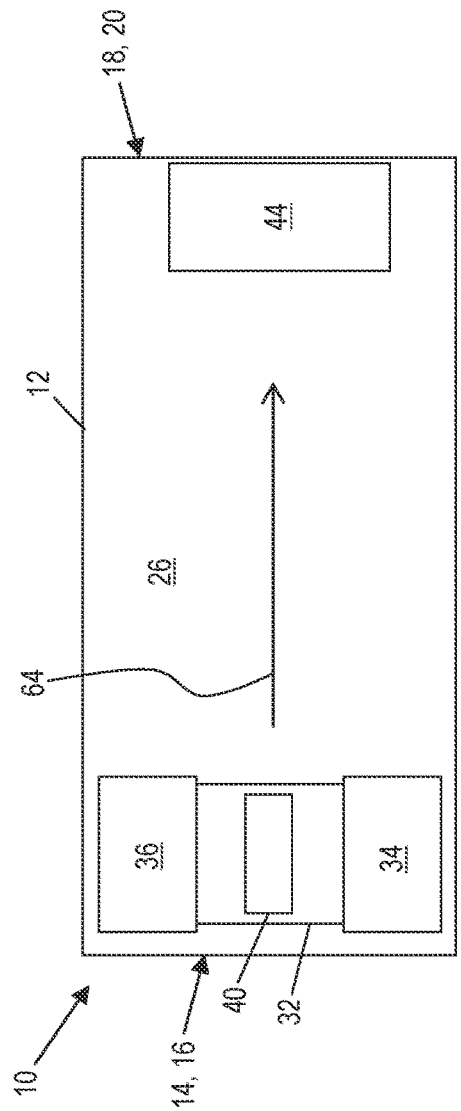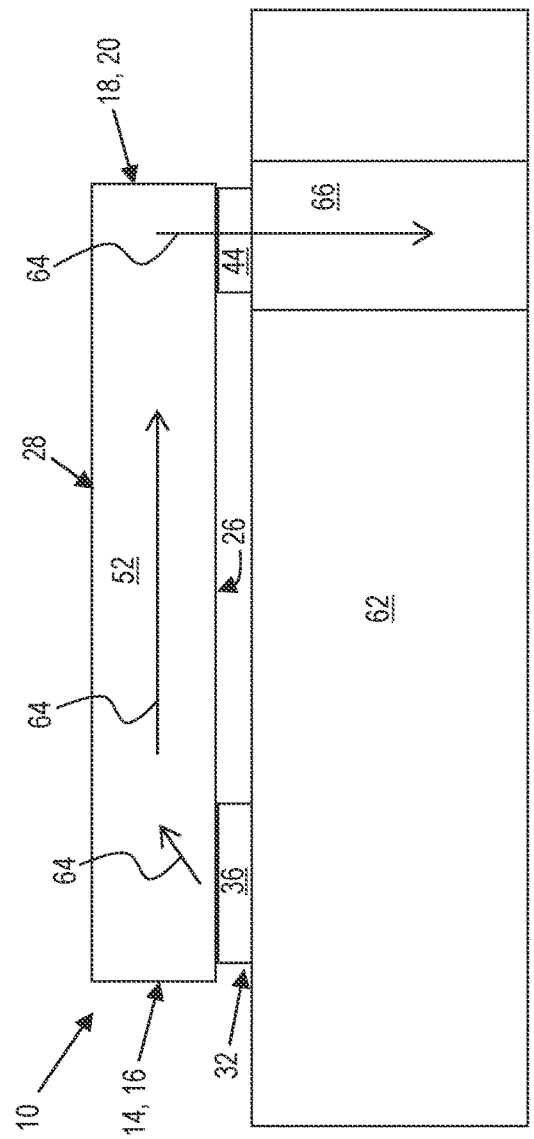

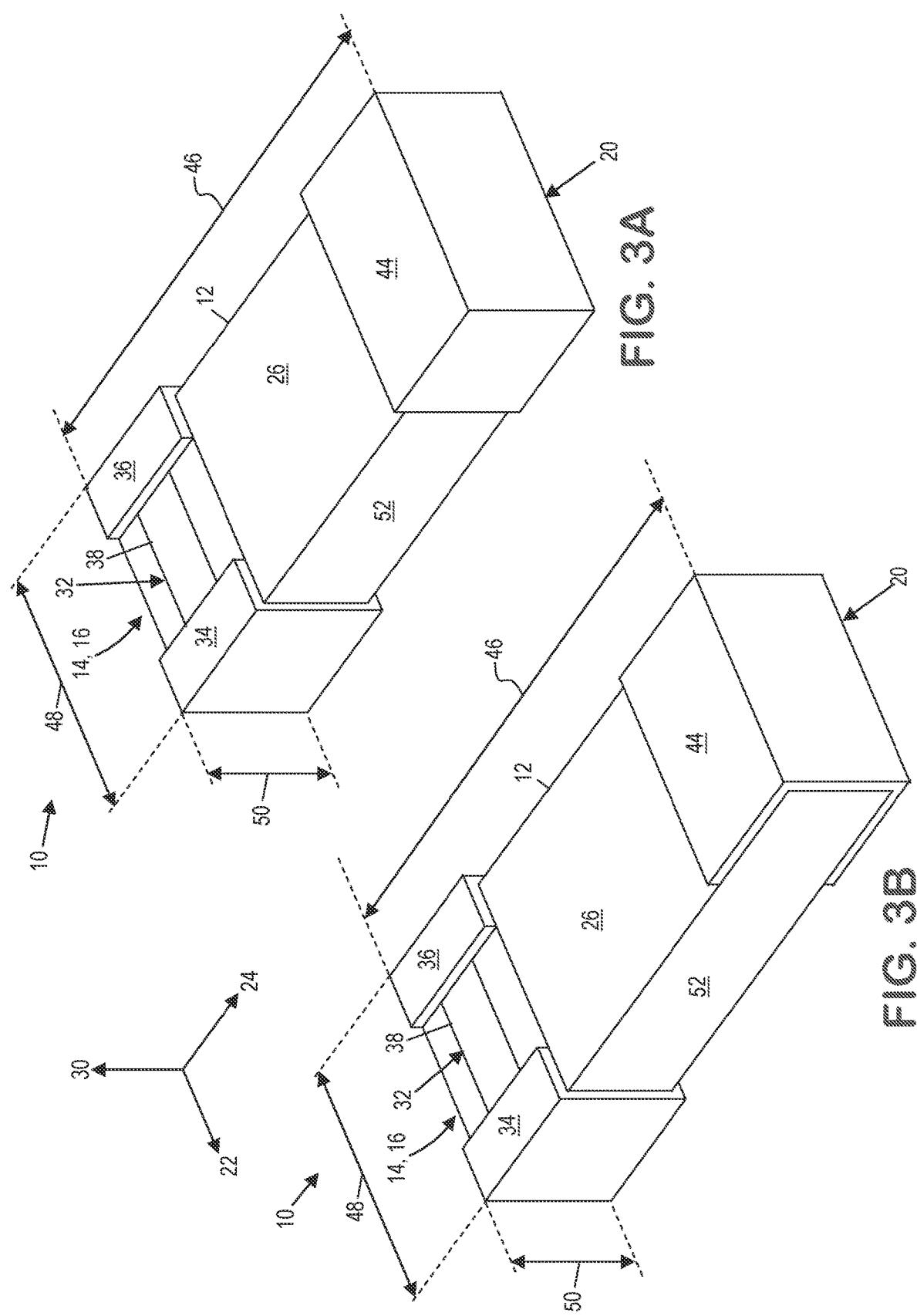

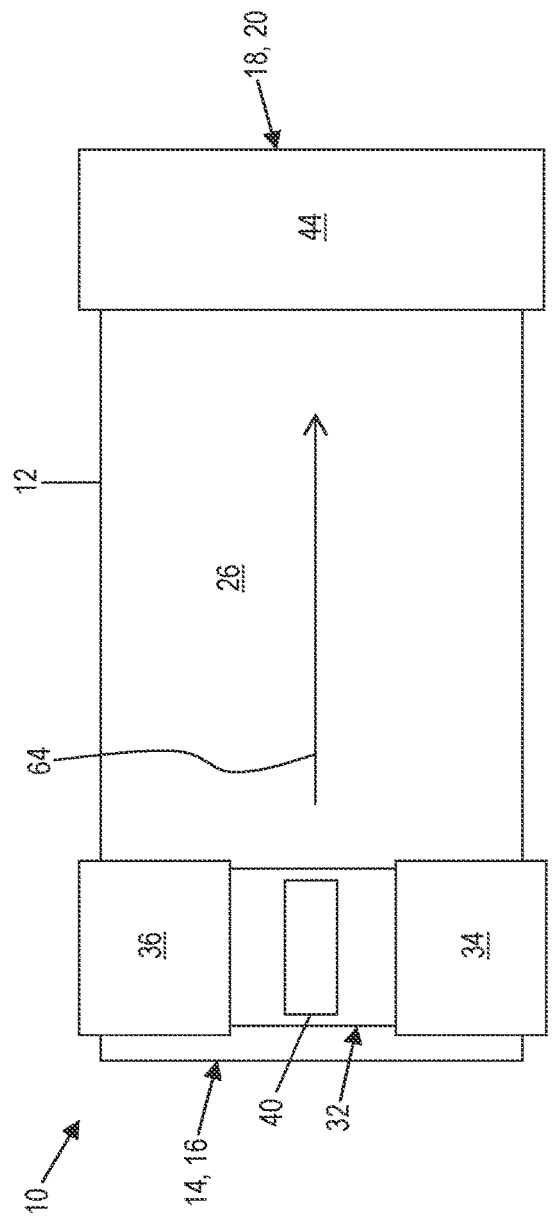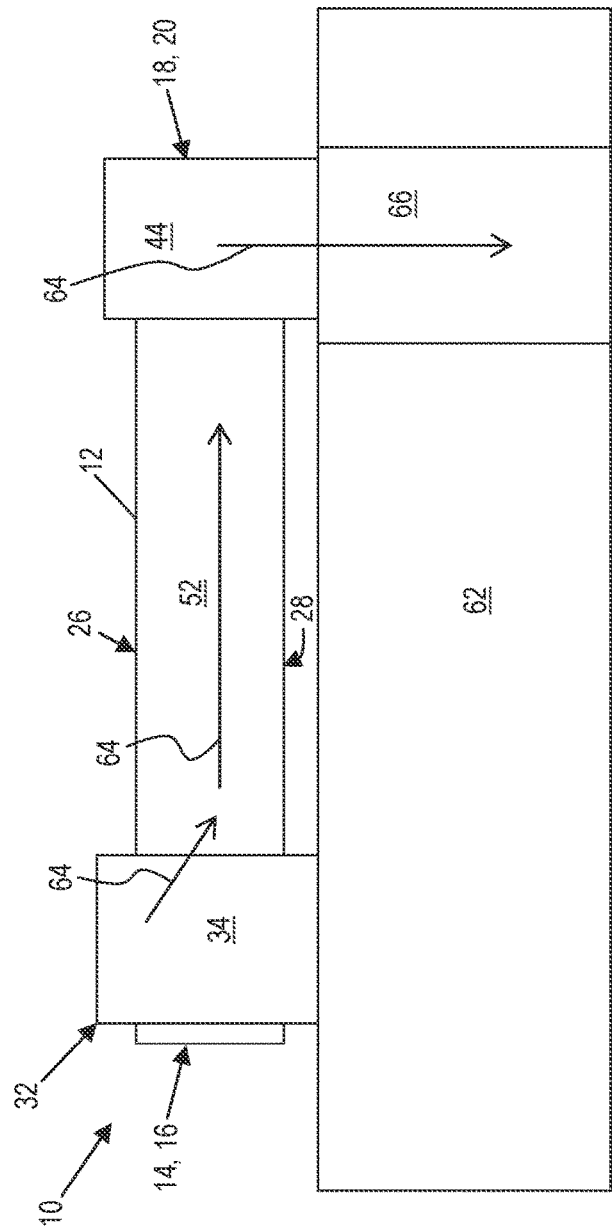

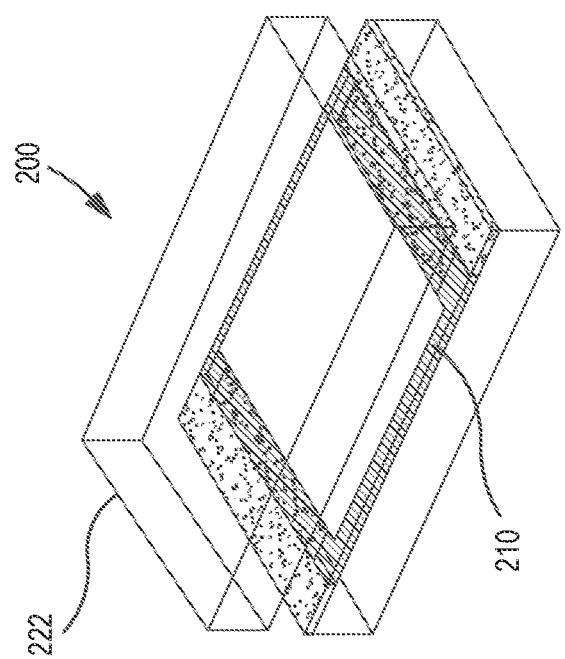
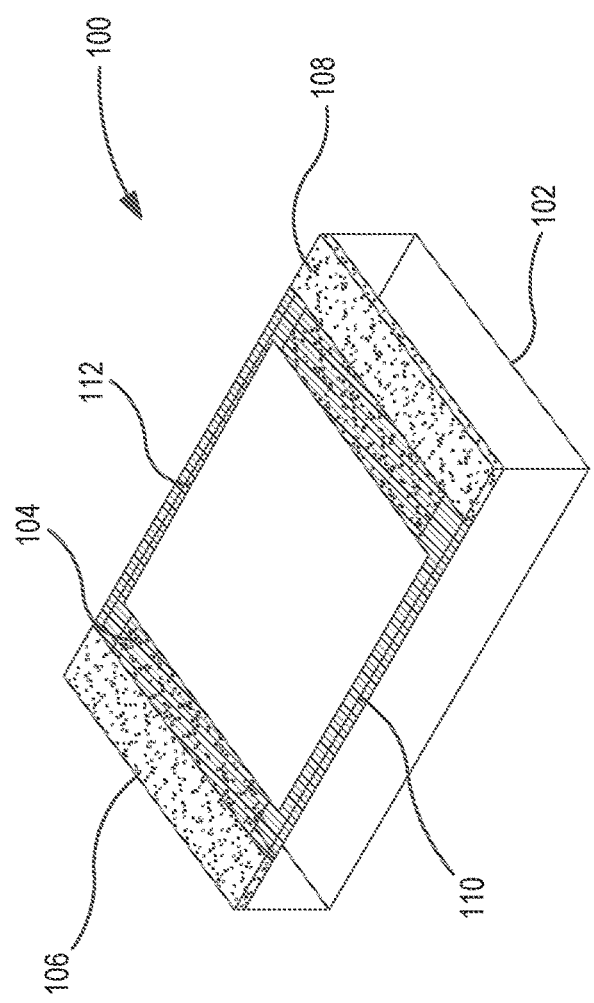

HIGH FREQUENCY AND HIGH POWER THIN-FILM COMPONENT

CROSS REFERENCE TO RELATED APPLICATION

The present application is a continuation of U.S. Application Ser. No. 16/431,847 having a filing date of Jun. 5, 2019, which claims filing benefit of U.S. Provisional Patent Application Ser. No. 62/681,262 having a filing date of Jun. 6, 2018, which are incorporated herein by reference in their entirety.

BACKGROUND OF THE INVENTION

High frequency radio signal communication has increased in popularity. For example, the demand for increased data transmission speed for wireless connectivity has driven demand for high frequency components, including those configured to operate at 5G spectrum frequencies. At the same time, a trend towards miniaturization has increased the demand for smaller passive components. Miniaturization of passive components, however, generally undesirably reduces power handling capacity. A compact, high frequency component, such as a resistor, that is capable of operating at elevated power levels would be welcomed in the art.

SUMMARY OF THE INVENTION

In accordance with one embodiment of the present disclosure, a surface mount component includes an electrically insulating beam that is thermally conductive. The electrically insulating beam has a first end and a second end that is opposite the first end. The surface mount component includes a thin-film component formed on the electrically insulating beam adjacent the first end of the electrically insulating beam. A heat sink terminal is formed on the electrically insulating beam adjacent a second end of the electrically insulating beam.

In accordance with one embodiment of the present disclosure, a surface mount component includes an electrically insulating beam that is thermally conductive and a thin-film component formed on the electrically insulating beam. The thin-film component has an area power capacity of greater than about 0.17 W/mm² at about 28 GHz.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures, in which:

FIG. 2A is a top down view of the embodiment of the flip-chip surface mount component depicted in FIG. 1;

FIG. 2B is a side elevation view of the embodiment of the flip-chip surface mount component depicted in FIG. 1 mounted on a mounting surface, such as a printed circuit board;

FIG. 3A is a perspective views of an embodiment of a surface mount component having wrap-around terminals in which a heat sink terminal is disposed on a side surface of a beam of the surface mount component in accordance with aspects of the presently disclosed subject matter;

FIG. 3B is a perspective views of another embodiment of a surface mount component having wrap-around terminals in which a heat sink terminal is not disposed on a side surface of a beam of the surface mount component in accordance with aspects of the presently disclosed subject matter;

FIG. 4A is a top down view of the embodiment of the surface mount component depicted in FIG. 3A;

FIG. 4B is a side elevation view of the embodiment of the surface mount component depicted in FIG. 3A mounted on a mounting surface, such as a printed circuit board;

FIG. 5A is a perspective view of selected portions of an embodiment of a thin-film resistor, which may be included as a part of a surface mount component, in accordance with aspects of the presently disclosed subject matter;

FIG. 5B is a perspective view of the embodiment of the thin-film resistor depicted in FIG. 5A further including a cover, in accordance with aspects of the presently disclosed subject matter;

Figure 1:
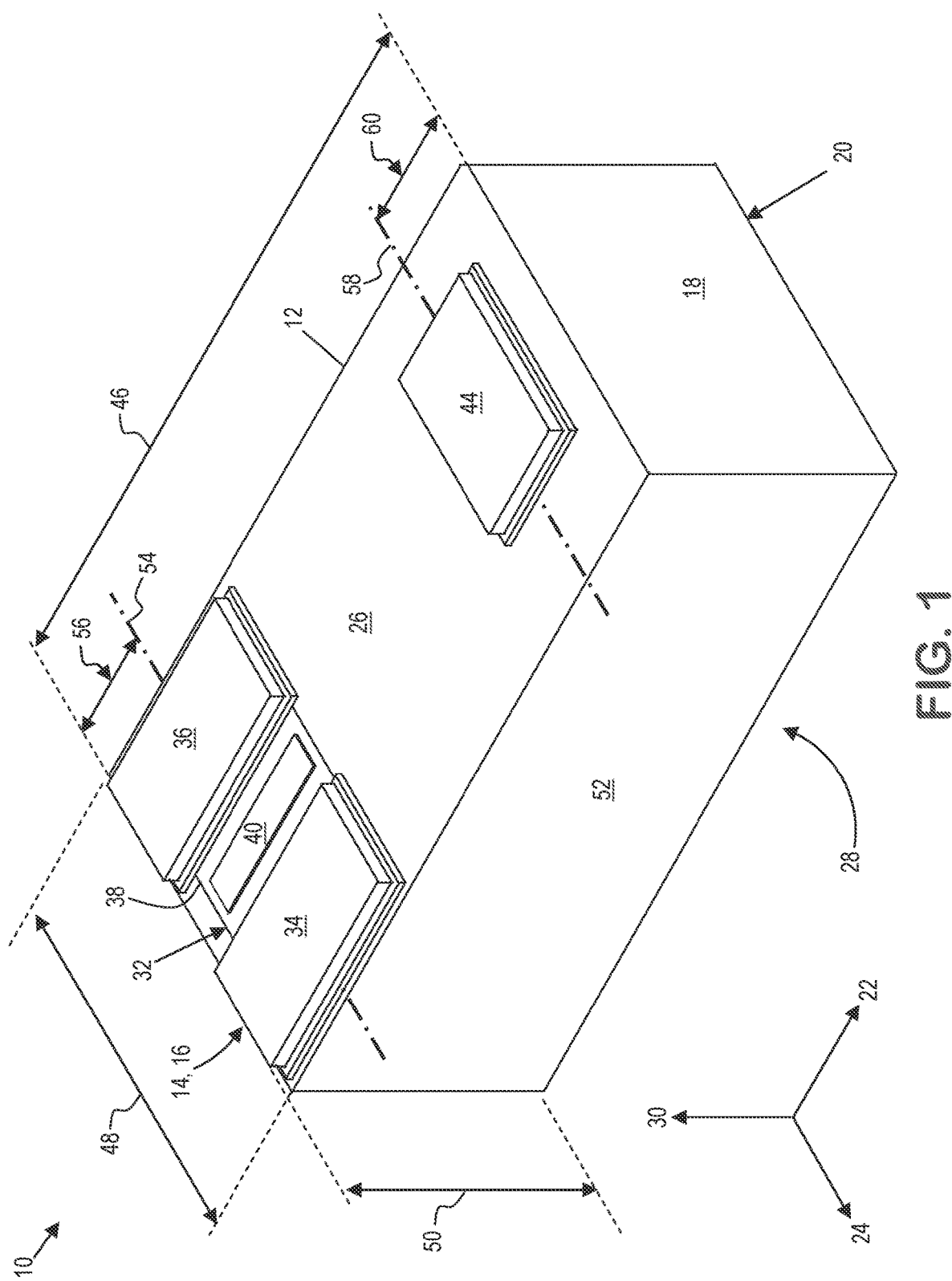
FIG. 1 is a perspective view of one embodiment of a flip-chip surface mount component including a thin-film component in accordance with aspects of the presently disclosed subject matter.

Repeat use of reference characters in the present specification and drawings is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

Generally speaking, the present invention is directed to a surface mount component having excellent heat dissipating capabilities. The surface mount component can include an electrically insulating beam that is thermally conductive. The electrically insulating beam can have a first end and a second end that is opposite the first end. The surface mount component can include a thin-film component formed on the electrically insulating beam adjacent the first end of the electrically insulating beam. A heat sink terminal can be formed on the electrically insulating beam adjacent a second end of the electrically insulating beam. In some embodiments, the thin-film component can have an area power capacity of greater than about 0.17 W/mm² at about 28 GHz.

"Area power capacity" (W/mm²) may be defined as power capacity (W) divided by the area, or "footprint", of the component. Area power capacity may be a suitable metric for quantifying a combination of high power handling and compact size. In other words, a high area power capacity may be indicative of a compact component that has a high power capacity relative to its size, e.g., footprint.

The electrically insulating beam facilitates heat flow away from the thin-film component, which allows the thin-film component to operate at higher power levels without overheating. Current flowing through the thin-film component generates heat that can undesirably overheat the resistor. By improving heat dissipation away from the component, the component may have a larger power capacity. In other words, the component may be able to dissipate energy at a greater rate without overheating.

In some embodiments, the thin-film component may include a thin-film resistor. The thin-film resistor can include a resistive layer and a frequency compensating conductive layer arranged over the resistive layer. A separator layer (e.g., adhesive) can be disposed between the resistive layer and the frequency compensating conductive layer such that the frequency compensating conductive layer is not in electrical contact with the resistive layer. In some embodiments, the frequency compensating conductive layer can be in electrical contact with at least one of the terminals of the thin-film resistor. However, in other embodiments, the frequency compensating conductive layer can be electrically isolated from both terminals. The frequency compensating conductive layer and the resistive layer may form a capacitance therebetween. This capacitance may improve the frequency response characteristics of the thin-film resistor, e.g., at high frequencies and/or across a broad range of frequencies.

The surface mount component can be mounted on a printed circuit board for electrical connection with other components. The heat sink terminal of the surface mount component can be configured to connect with a heat sink on the printed circuit board. For example, in some embodiments, the heat sink terminal can be connected with a thermal via, or other suitable heat sink (e.g., a thermal fin assembly). The heat sink terminal may be electrically separate from the terminals of the thin-film component. The beam may have a high electrical resistance such that a flow of electrical current from the thin-component to the heat sink terminal may be prevented or substantially prevented. Yet heat may readily flow from the thin-film component to the heat sink terminal. This configuration may advantageously dissipate heat from the thin-film component.

In some embodiments, the thin-film component may include a thin-film resistor. The thin-film resistor may be configured to exhibit a variety of resistance values, as desired. For example, in some embodiments the thin-film resistor may have a resistance that ranges from about 1Ω to about 2,000Ω, in some embodiments from about 2Ω to about 1,000Ω, in some embodiments from about 5Ω to about 750Ω, in some embodiments from about 10Ω to about 500Ω, in some embodiments from about 25Ω to about 400Ω.

The resistive layer of the thin-film resistor may be formed using a variety of thin film techniques, including photolithography or any other suitable patterning technique, etching, PECVD (Plasma Enhanced Chemical Vapor Deposition) processing, or other additive and/or subtractive techniques. The resistive layer of the thin-film resistor may be formed from a variety of suitable resistive materials. For example, the resistive layer may include tantalum nitride (TaN), nickel chromium (NiCr), tantalum aluminide, chromium silicon, titanium nitride, titanium tungsten, tantalum tungsten, oxides and/or nitrides of such materials, and/or any other suitable thin film resistive materials.

The resistive layer may have any suitable thickness. For example, in some embodiments a thickness of the resistive layer may range from about 0.001 µm to about 1,000 µm, in some embodiments from about 0.01 µm to about 100 µm, in some embodiments from about 0.1 µm to about 50 µm, in some embodiments from about 0.5 µm to about 20 µm.

The thin-film resistor may provide excellent frequency transmission characteristics over a broad frequency range. For example, in some embodiments, the thin-film resistor can exhibit a transmission coefficient ($S_{21}$) that remains substantially constant from about 20 GHz to about 40 GHZ (or greater). For example, the thin-film resistor can exhibit a first transmission coefficient that varies less than 20% from about 20 GHz to about 40 GHz as compared with the transmission coefficient of the thin-film resistor at 20 GHz, in some embodiments less than 10%, in some embodiments less than 5%, in some embodiments less than 2%, and in some embodiments less than 1%.

In some embodiments, the transmission coefficient of the thin-film resistor may remain substantially constant over 5G spectrum frequencies. For example, in some embodiments, the transmission coefficient may vary less than about 20% across frequencies ranging from about 20 GHz to about 60 GHz, or higher, in some embodiments less than about 10%, in some embodiments less than about 5%, in some embodiments less than about 2%, and in some embodiments less than about 1%. In some embodiments, the transmission coefficient may vary less than about 20% across frequencies ranging from about 20 GHz to about 40 GHZ, or higher, in some embodiments less than about 10%, in some embodiments less than about 5%, in some embodiments less than about 2%, and in some embodiments less than about 1%.

As an example, in one embodiment, the transmission coefficient of the thin-film resistor may be about −6.025 dB at 1 GHZ, and the transmission coefficient of the thin-film resistor may range from about −7.23 dB to about −5.59 dB for frequencies ranging from 1 GHz to about 30 GHz, or greater, in some embodiments from about −6.63 dB to about −5.63 dB, in some embodiments from about −6.15 dB to about −5.65 dB, and in some embodiments from about −6.09 dB to about −5.66 dB.

In some embodiments, the resistance of the thin-film resistor may remain substantially constant over 5G spectrum frequencies. For example, in some embodiments, the resistance of the thin-film resistor may vary less than about 20% across frequencies ranging from about 20 GHz to about 40 GHZ, or higher (e.g., up to about 60 GHZ.), in some embodiments less than about 15%, in some embodiments less than about 10%, in some embodiments less than about 5%, and in some embodiments less than about 1%.

In some embodiments, the thin-film resistor may include a frequency compensating conductive layer, which may contribute to the frequency response characteristics and/or consistent resistance of the thin-film resistor. The frequency compensating conductive layer may be arranged in parallel with the resistive layer and form a capacitance therebetween.

In some embodiments, the frequency compensating conductive layer may be formed using thin-film methods. For example, the frequency compensating conductive layer be formed using a variety of thin film techniques, including photolithography or any other suitable patterning technique, etching, PECVD (Plasma Enhanced Chemical Vapor Deposition) processing, or other additive and/or subtractive techniques. The frequency compensating conductive layer, however, may be formed using any suitable technique, such as printing, dipping, striping, or other techniques for forming conductive layers.

The frequency compensating conductive layer may be formed from a variety of suitable conductive materials. For example, the frequency compensating conductive layer may include aluminum, copper, gold, silver, nickel, mixtures thereof, and/or any other suitable conductive material.

The frequency compensating conductive layer may have any suitable thickness. For example, in some embodiments a thickness of the frequency compensating conductive layer may range from about 0.001 µm to about 1,000 µm, in some embodiments from about 0.01 µm to about 100 µm, in some embodiments from about 0.1 µm to about 50 µm, in some embodiments from about 0.5 µm to about 20 µm.

The electrically insulating beam may have a high thermal conductivity. For example, in some embodiments, the electrically insulating beam may comprise a material having a thermal conductivity, at about 22° C., that ranges from about 100 W/m·° C. to about 300 W/m·° C., in other embodiments from about 125 W/m·° C. to about 250 W/m·° C., in other embodiments from about 150 W/m·° C. to about 200 W/m·° C. In some embodiments, the thermal resistance across an overall length of the surface mount component at about 22° C. may range from about 2° C./W to about 10° C./W, and in some embodiments from about 3° C./W to about 7° C./W.

The electrically insulating beam may be formed from a variety of suitable materials. For example, in some embodiments, the electrically insulating beam may comprise aluminum nitride. For example, in some embodiments the electrically insulating beam may be made from any suitable composition including aluminum nitride. In some embodiments, the beam may be made primarily from aluminum nitride. For example, the beam may contain additives or impurities. Additional suitable materials for the beam include beryllium oxide, aluminum oxide, boron nitride, silicon nitride, magnesium oxide, zinc oxide, silicon carbide, any suitable ceramic material, and mixtures thereof.

In some embodiments, the thin-film component may include a heat sink terminal. The heat sink terminal may be configured to connect with a heat sink on a mounting surface, such as a printed circuit board. For example, in some embodiments the heat sink terminal may include one or more layers of thermally conductive material on the beam.

In some embodiments, the terminals (e.g., terminals of the thin-film component and/or heat sink terminal) may include one or more layer. The layers may be formed from a variety of materials and using a variety of methods. For example, the terminals may correspond to one or more layers of thin-film or thick-film conductive materials applied by selected formation techniques, including but not limited to printing, dipping, striping, or other techniques for forming conductive layers. Different types of conductive materials may be used. For example, thin-film layers of plating (e.g., nickel, copper, tin, gold, etc.) may be formed over an initial thick-film layer of conductive paste.

In one exemplary embodiment, the terminals may include at least one organometallic layer, e.g., a layer of conductive polymer material to provide flexibility in the external terminals. Use of such material can help ensure electrical integrity is maintained during and after external forces such as mechanical or thermo-mechanical stresses are applied to a component. In one exemplary embodiment, such a conductive polymer corresponds to a polymer, resin, epoxy, polyamide, thermoset, thermoplastic, or other polymer material loaded with conductive metal particles such as, but not limited to, silver, nickel, aluminum, platinum, copper, palladium, gold, alloys of such materials or others. In some particular embodiments, such a conductive polymer is chosen to be a low temperature material such that the curing temperature is less than the curing temperature of other materials in the component, such as the adhesive or sealant layers. In addition, the conductive polymer material may be chosen such that it is capable of withstanding certain reflow temperatures in a circuit mounting environment. In one embodiment, the conductive polymer termination material is applied over a base layer of conductive metal, such as copper, nickel, or the like. In another embodiment, the conductive polymer termination layer is provided directly to the peripheral component surfaces such that the conductive polymer termination layer is in direct electrical connection with exposed portions of the internal conductive pads of a component. Still further, additional termination layers may be formed over the layer of conductive polymer termination material. For example, one or more layers of plated nickel, copper, or tin may be provided over the layer of conductive polymer termination material.

In some embodiments, one or more of the terminals may include magnetic or magnetized materials. For example, one or more of the terminals may include an outer layer over a first layer. The first layer may be magnetic or magnetized, and the outer layer may be corrosion-resistant. For example, an outer layer of gold may be disposed over a first layer of copper or steel. In other embodiments, an outer layer, such as gold, may be disposed over a non-magnetic first layer, such as a ceramic. The first layer and/or outer layer may include gold, silver, platinum, nickel, copper, steel, and/or any other suitable material.

The terminals may have a variety of suitable configurations. For example, in some embodiments, the terminals of the thin-film components and the heat sink terminal may be located on the same surface of the electrically insulating beam. Such a configuration may be referred to as a "flip chip" configuration because the thin-film component and heat sink terminal are formed on a "top" surface of the beam, and the beam is then flipped such that the "top" surface is mounted on the printed circuit board.

Alternatively, in other embodiments, one or more of the terminals may be disposed on other surfaces of the electrically insulating beam. This may allow the surface mounted component to be mounted in an alternative orientation. For example, in some embodiments, the thin-film component may be formed on a first surface of the beam, and the terminals may wrap around the insulating beam such that they are at least partially formed on a second surface that is opposite the first surface. This may allow the second surface of the surface mounted component to be mounted to the printed circuit board such that first surfaces faces away from the printed circuit board and the thin-film component is exposed. Such a configuration may provide improved heat dissipation away from the thin-film component, for example, through convection with ambient air surrounding the thin-film component.

Regardless of the particular configuration employed, the present inventors have discovered that through selective control over the arrangement and materials of a thin-film component formed on a thermally conductive beam, a compact surface mount component can be achieved that provides improved heat dissipation and power handling capabilities.

For example, in some embodiments, the thin-film component (e.g., a thin-film resistor) can operate at elevated power levels at high frequencies (e.g., for about 20 GHz or greater) without overheating and being damaged. For example, in some embodiments, the thin-film component may have a power capacity of greater than about 4 W at about 28 GHZ, in some embodiments about greater than about 3 W, in some embodiments greater than about 2 W, in some embodiments greater than about 1 W, in some embodiments greater than about 0.5 W, in some embodiments greater than 0.33 W. For example, in some embodiments, the thin-film component may have a power capacity that is greater than 0.33 W and less than about 4 W at about 28 GHZ, in some embodiments greater than about 0.5 W and less than about 3 W, and in some embodiments greater than about 1 W and less than about 2 W.

In some embodiments, the thin-film component may have a power capacity of greater than about 4 W at frequencies ranging from about 20 GHz to about 40 GHz or higher (e.g., up to about 60 GHZ), in some embodiments greater than about 3 W, in some embodiments greater than about 2 W, in some embodiments greater than about 1 W, in some embodiments greater than about 0.5 W, and in some embodiments greater than 0.33 W. For example, in some embodiments, the thin-film component may have a power capacity that is greater than 0.33 W and less than about 4 W for frequencies ranging from about 20 GHz to about 40 GHz or higher (e.g., up to about 60 GHZ), in some embodiments greater than about 0.5 W and less than about 3 W, and in some embodiments greater than about 1 W and less than about 2 W.

In some embodiments, the thin-film component may have a compact size, e.g., footprint. For example, in some embodiments, the thin-film component may have an overall length from about 0.1 mm to about 5 mm, in some embodiments, from about 0.2 mm to about 4 mm, in some embodiments from about 0.3 mm to about 3 mm, in some embodiments, from about 0.4 mm to about 2 mm, e.g., about 1 mm.

In some embodiments the thin-film component may have an overall width from about 0.05 mm to about 2.5 mm, in some embodiments from about 0.1 mm to about 2 mm, in some embodiments from about 0.15 mm to about 1.5 mm, in some embodiments from about 0.2 mm to about 1.3 mm, and in some embodiments from about 0.3 mm to about 1 mm, e.g., about 0.5 mm.

In some embodiments, the thin-film component may have an overall thickness from about 0.05 mm to about 2.5 mm, in some embodiments from about 0.1 mm to about 2 mm, in some embodiments from about 0.15 mm to about 1.5 mm, in some embodiments from about 0.2 mm to about 1.3 mm, and in some embodiments from about 0.3 mm to about 1 mm, e.g., about 0.5 mm.

As indicated above, "area power capacity" ($W/mm^2$) may be defined as power capacity (W) divided by the area or footprint of the component. The "area" or "footprint" of the component refers to the cross-sectional area of the component (e.g., the area of a mounting surface, such as a printed circuit board, that is occupied by the surface mount component once mounted). Area power capacity may be a suitable metric for quantifying a combination of improved power handling and compact size.

In some embodiments, the thin-film component may have an area power capacity of greater than about 0.17 $W/mm^2$ at about 28 GHZ, in some embodiments greater than about 0.2 $W/mm^2$ at about 28 GHZ, in some embodiments greater than about 0.25 $W/mm^2$, in some embodiments greater than about 0.5 $W/mm^2$, in some embodiments greater than about 1 $W/mm^2$, in some embodiments greater than about 2 $W/mm^2$, in some embodiments greater than about 5 $W/mm^2$, and in some embodiments greater than about 10 $W/mm^2$. For example, in some embodiments the thin-film component may have an "area power capacity" ranging from about 0.17 $W/mm^2$ to about 10 $W/mm^2$ at about 28 GHZ, in some embodiments from about 0.25 $W/mm^2$ to about 5 $W/mm^2$, and in some embodiments from about 0.5 $W/mm^2$ to about 2 $W/mm^2$.

In some embodiments, the thin-film component may have an area power capacity of greater than about 0.17 $W/mm^2$ from about 20 GHz to about 40 GHz or higher (e.g., up to 60 GHZ), in some embodiments greater than about 0.2 $W/mm^2$, in some embodiments greater than about 0.25 $W/mm^2$, in some embodiments greater than about 0.5 $W/mm^2$, in some embodiments greater than about 1 $W/mm^2$, in some embodiments greater than about 2 $W/mm^2$, in some embodiments greater than about 5 $W/mm^2$, and in some embodiments greater than about 10 $W/mm^2$. For example, in some embodiments the thin-film component may have an area power capacity ranging from about 0.17 $W/mm^2$ to about 10 $W/mm^2$ from about 20 GHz to about 40 GHz or higher (e.g., up to 60 GHz), in some embodiments from about 0.25 $W/mm^2$ to about 5 $W/mm^2$, and in some embodiments from about 0.5 $W/mm^2$ to about 2 $W/mm^2$.

In some embodiments, the thin-film component may be located adjacent a first end of the beam. For example, the terminals of the thin-film component may have a centerline, and the centerline may be offset by a thin-film terminal offset distance from the first end (e.g., from a first end face) of the beam. A ratio of an overall length of the thin-film component to the thin-film terminal offset distance may be about 2 or greater, in some embodiments about 2.5 or greater, in some embodiments about 3 or greater, in some embodiments about 5 or greater, in some embodiments about 7 or greater, in some embodiments about 10 or greater, and in some embodiments about 20 or greater.

In some embodiments, the heat sink terminal may be located adjacent a second end of the beam that is opposite the first end of the beam. For example, the heat sink terminal may define a centerline that is offset from the second end (e.g., second end face) of the beam by a heat sink terminal offset distance. A ratio of the overall length of the thin-film component to the heat sink terminal offset distance may be about 2 or greater, in some embodiments about 2.5 or greater, in some embodiments about 3 or greater, in some embodiments about 5 or greater, in some embodiments about 7 or greater, in some embodiments about 10 or greater, and in some embodiments about 20 or greater.

I. Flip-Chip

In some embodiments, the surface mount component may be configured as a flip-chip device. For example, one or more elements of the component may be formed on a face of the device that is configured for mounting adjacent a mounting surface, such as a printed circuit board. Referring to FIG. 1, a surface mount component 10 may include an electrically insulating beam 12 having a first end face 14 (not visible in FIG. 1) adjacent a first end 16 and a second end face 18 adjacent a second end 20. The second end face 18 may be opposite the first end face 14 in an X direction 22. In some embodiments, the first end face 14 may be parallel with the second end face 18. The beam 12 may also have a first surface 26 (e.g., a top surface as illustrated in FIG. 1) and a second surface 28 (not visible in FIG. 1) that is opposite the first surface 26. The second surface 28 may be offset from the first surface 26 in a Z direction 30, which is perpendicular to each of the X direction 22 and a Y direction 24. In some embodiments, the first and second surfaces 26, 28 of the beam 12 may be parallel to each other.

The surface mount component 10 may include a thin-film component 32. The thin-film component 32 may include a first terminal 34 and a second terminal 36. The thin-film component 32 may further include one or more thin-film elements operatively connected with one or more of the first terminal 34 and the second terminal 36 to form a resistor, capacitor, inductor, and/or any other suitable component.

For example, in some embodiments, the thin-film component 32 may be or include a thin-film resistor. The thin-film resistor 32 may include a resistive layer 38 formed on the first surface 26 of the beam 12. The resistive layer 38 may be formed directly on the first surface 26 or, alternatively, may be formed on another layer (e.g., a thermally conductive layer) that is formed on the first surface 26. The resistive layer 38 may be electrically connected between the first terminal 34 and the second terminal 36.

In some embodiments, the thin-film resistor 32 may include a frequency compensating conductive layer 40 that is arranged over the resistive layer 38. Various configurations of the frequency compensating conductive layer 40 are discussed in greater detail below with regards to FIGS. 5 through 10.

Still referring to FIG. 1, in some embodiments, the surface mount component 10 may include a heat sink terminal 44. In some embodiments, the heat sink terminal 44 may be disposed on the first surface 26 of the beam 12.

An overall length 46, overall width 48, and an overall thickness 50 of the surface mount component 10 may be defined in the X direction 22, Y direction 24, and Z direction 30, respectively. The overall length 46, overall width 48, and overall thickness 50 of the surface mount component 10 may include the thin-film component 32 and/or the terminals 34, 36, 44.

In some embodiments, the first terminal 34 and/or second terminal 36 may be adjacent the first end 16 of the beam 12. The first terminal 34 and second terminal 36 may be generally similar in size and shape and may be spaced apart in the Y direction 24. The first terminal 34 and second terminal 36 may share a centerline 54 that generally extends in the Y-direction 24. The centerline 54 may be defined as the center of the first terminal 34 and second terminal 36 with respect to the X direction 22. The centerline 54 may be offset from the first end 16 (e.g., from the first end face 14) of the beam 12 by a thin-film terminal offset distance 56. A ratio of the overall length 46 of the thin-film component 10 to the thin-film terminal offset distance 56 may be about 2 or greater.

The heat sink terminal 44 may be adjacent the second end 20 of the beam 12. The heat sink terminal 44 may define a centerline 58 that generally extends in the Y-direction 24. The centerline 58 may be defined as the center of the heat sink terminal 44 with respect to the X direction 22. The centerline 58 may be offset from the second end 18 (e.g., second end face 18) of the beam 12 by a heat sink terminal offset distance 60. A ratio of the overall length 46 of the thin-film component 10 to the heat sink terminal offset distance 60 may be about 2 or greater.

Referring to FIGS. 2A and 2B, the surface mount component 10 may be mounted to a printed circuit board 62 or other suitable substrate. The surface mount component 10 may be "flipped" from the orientation of FIG. 1, such that the first surface 26 is adjacent (e.g., facing) the printed circuit board 62. Heat that is generated by the thin-film component 32 may be conducted away from the thin-film component 32 by the beam (illustrated by arrows 64). The heat may then flow through the beam 12, through the thermal sink terminal 44, and into a thermal via 66 or other heat sink structure to facilitate heat flow away from the thin-film component 32.

II. Wrap-Around Terminals

Referring to FIGS. 3A and 3B, in some embodiments, the surface mount component 10, one or more of the terminals 34, 36, 44 may be configured as wrap-around terminals. This may allow the surface mount component to be mounted such that one or more elements (e.g., the thin film component 32) are located on a surface facing away from the mounting surface.

For example, referring to FIG. 3A, the first terminal 34, second terminal 36, and heat sink terminal 44 may warp around the beam 12 such that the terminals 34, 36, 44 are additionally disposed on at least one of a pair of side surfaces 52. The heat sink terminal 44 may also be disposed on the side surfaces 52. The first and second terminals 34, 36 may also be disposed on the second end face 18. Referring to FIG. 3B, in some embodiments, the heat sink terminal 44 may wrap around the second end (not visible in FIG. 3B) without being disposed on one or both side surfaces 52.

Referring to FIGS. 4A and 4B, the surface mount component 10 may be mounted to a printed circuit board 62 such that the thin film component 32 is located on a surface facing away from the mounting surface. Heat that is generated by the thin-film component 32 may be conducted away from the thin-film component 32 by the beam (illustrated by arrows 64). The heat may then flow through the beam 12, through the heat sink terminal 44, and into a thermal via 66 or other heat sink structure to facilitate heat flow away from the thin-film component 32.

III. Frequency Compensating Layer

FIG. 5A illustrates an exemplary thin-film resistor 100 including a frequency compensating layer according to aspects of the present disclosure. For example, the thin-film resistor 100 may correspond to the thin-film component 32 discussed above with reference to FIGS. 1 through 4. The thin-film resistor 100 may include a resistive layer 104 (e.g., corresponding with the resistive layer 38 described above) formed on a substrate 102 (e.g., corresponding to a portion of the beam 12 discussed above). The layer of resistive layer 104 may be connected with first and second contact pads 106, 108. The first and second contact pads 106, 108 may correspond to the first terminal 34 and second terminal 36, respectively, described above. Alternatively, the first and second contact pads 106, 108 may be separate structures that are in contact with the first terminal 34 and second terminal 36, respectively.

In accordance with various specific embodiments of the presently disclosed subject matter, the resistive layer 104 may correspond to a layer of tantalum nitride (TaN), and conductive contact pads 106, 108 may correspond to layers of copper (Cu). In some embodiments, the resistive layer 104 may extend underneath the contact pads 106, 108. If the resistor is intended to be used as a wire-bondable device, contact pads 106, 108 may be comprised of wire bondable materials, such as Aluminum (Al), gold (Au), or other suitable materials.

A layer of adhesive 110 may cover the resistive layer 104 and/or portions of the upper surface of substrate 102. The adhesive 110 may, in some embodiments, extend over portions of the upper surface of contact pads 106, 108. The adhesive layer 110 may provide an insulating layer between the resistive layer 104 and one or more frequency compensating layers 112.

The frequency compensating layer(s) 112 may include a layer of conductive material. The frequency compensating layer 112 may be arranged generally parallel with the resistive layer 104 such that a capacitance is formed therebetween.

FIG. 5B illustrates a partially exploded view of another embodiment of a thin-film resistor 200 in accordance with aspects of the present disclosure. In some embodiments, a thin-film resistor 200 may be generally configured as the thin-film resistor 100 described above with reference to FIG. 5A, but may also include a cover 222 (e.g., comprising glass or another suitable material for protecting the resistive layer). In accordance with the presently disclosed subject matter, adhesive layer 210 secures glass cover 222 to the upper surface of the resistor components and thereby provides a protective covering for the components.

Figure 6B:
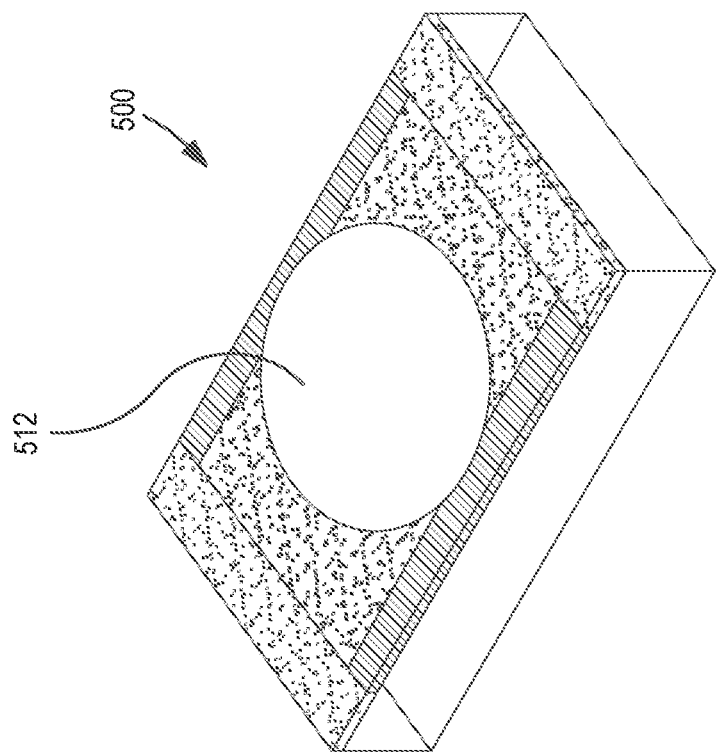
FIG. 6B is a perspective view of selected portions of another embodiment of a thin-film resistor, which may be included as a part of a surface mount component in accordance with aspects of the presently disclosed subject matter.
Figure 6A:
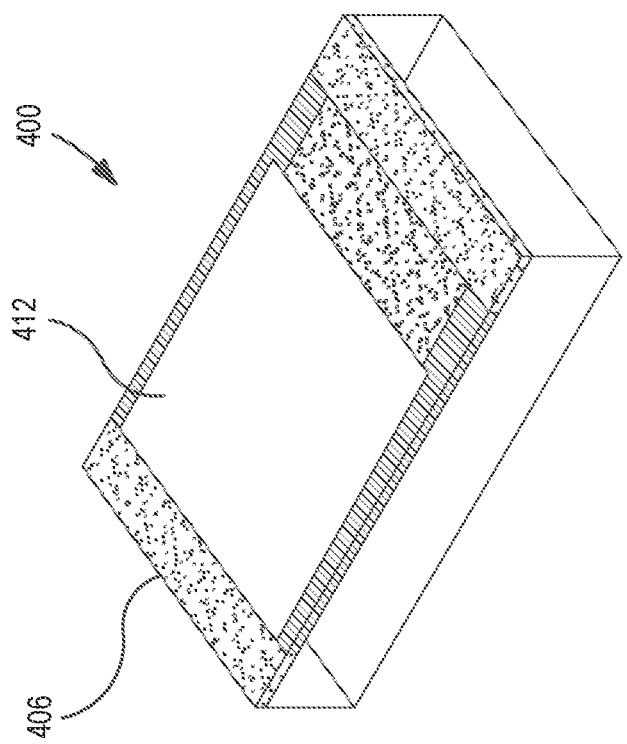
FIG. 6A is a perspective view of selected portions of an embodiment of a thin-film resistor, which may be included as a part of a surface mount component, in accordance with aspects of the presently disclosed subject matter.

FIG. 6A illustrates a portion of an alternative embodiment of a thin-film resistor 400 that is generally configured as the thin-film resistor 100 discussed above with reference to FIG. 5A. However, in some embodiments, the frequency compensating layer 412 may be in electrical contact with one of the contact pads 406.

FIG. 6B illustrates a portion of another alternative embodiment of a thin-film resistor 500, that is generally configured as the thin-film resistor 100 discussed above with reference to FIG. 5A. In some embodiments, the frequency compensating layer 512 may generally have a circular shape. However, the frequency compensating layer may have any shape that is suitable for providing the desired frequency compensation.

Figure 8:
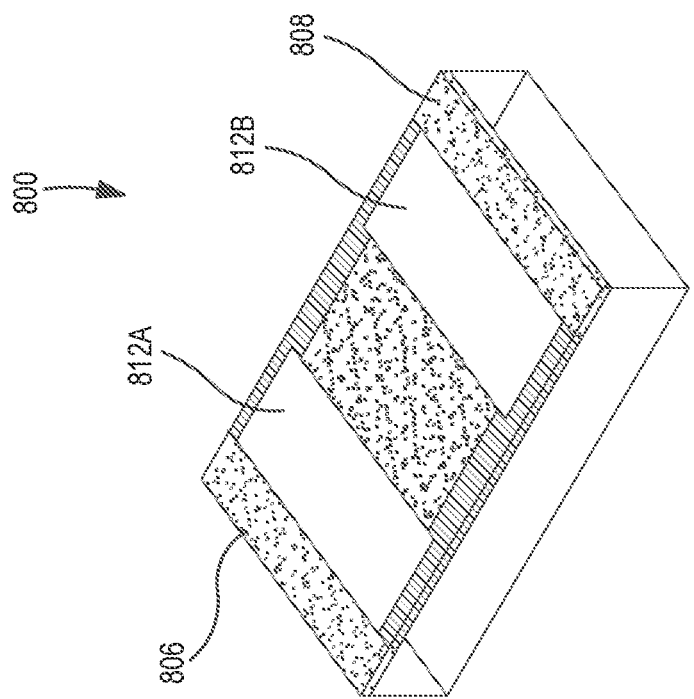
FIG. 8 illustrates a second configuration of frequency compensating layers, which may be included as a part of a surface mount component, in accordance with aspects of the presently disclosed subject matter.
Figure 7:
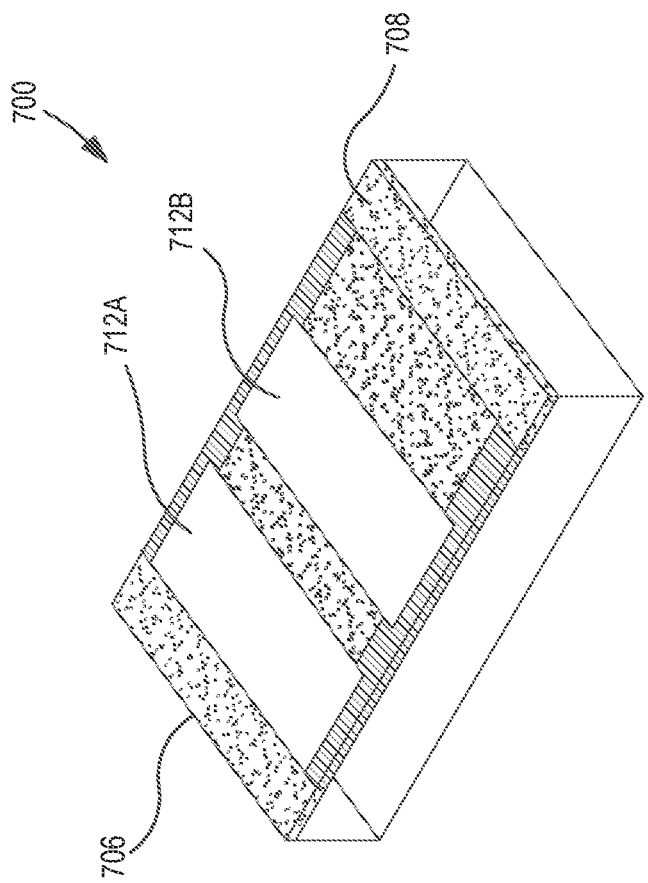
FIG. 7 illustrates a first configuration of frequency compensating layers, which may be included as a part of a surface mount component, in accordance with aspects of the presently disclosed subject matter.
Figure 10:
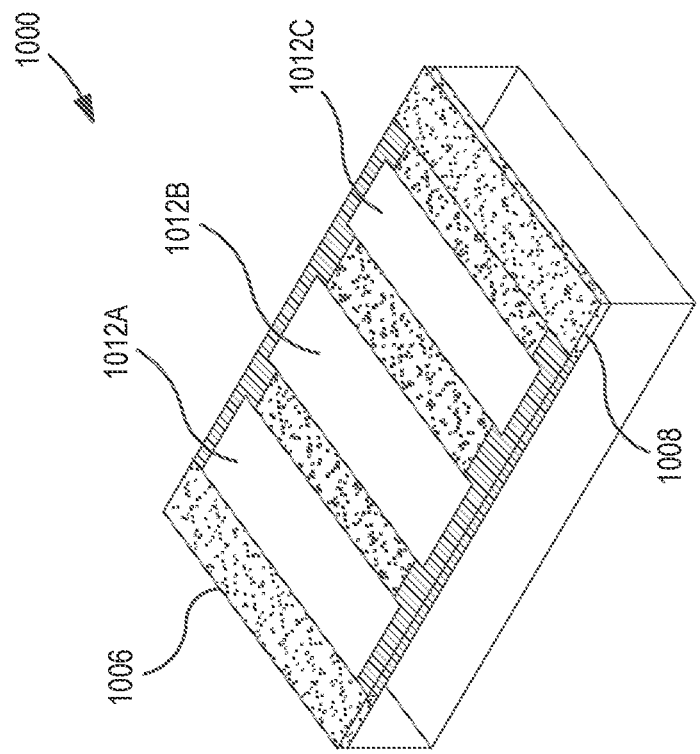
FIG. 10 illustrates a fourth configuration of frequency compensating layers, which may be included as a part of a surface mount component, in accordance with aspects of the presently disclosed subject matter.
Figure 9:
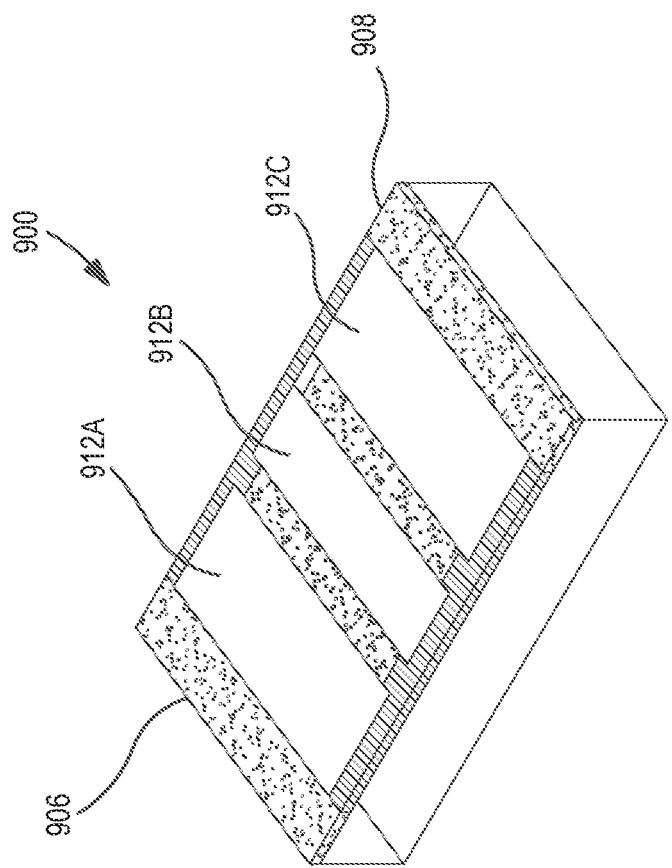
FIG. 9 illustrates a third configuration of frequency compensating layers, which may be included as a part of a surface mount component, in accordance with aspects of the presently disclosed subject matter.

FIGS. 7 through 10 illustrate further alternative embodiments of thin-film resistor(s) according to aspects of the present disclosure. In some embodiments, the thin-film resistor may include a plurality of conductive layers. For example, referring to FIG. 7, in some embodiments, a thin-film resistor 700 may include a first conductive layer 712A that is electrically connected with one contact pad 706 but free of electrical connection with the other contact pad 708. A second conductive layer 712B may free of direct electrical connection with either contact pad 706 or 708. Referring to FIG. 8, in some embodiments, a thin-film resistor 800 may include two conductive layers 812A, 812B, each coupled electrically with a respective contact pad 806, 808. Referring to FIG. 9, a thin-film resistor 900 may include three conductive layers 912A, 912B, 912C. Two of the conductive layers 912A, 912C may be directly electrically coupled with respective contact pads 906, 908. The third conductive layer 912B may be free of direct electrical connection with the contact pads 906, 908. Referring to FIG. 10, in some embodiments, a thin-film resistor 1000 may include three conductive layers 1012A, 1012B, 1012C. One layer (layer 1012A) may be directly electrically connected to one of the contact pad 1006, and the other two layers 1012B, 1012C may be free of direct electrical connection with the contact pads 1006, 1008.

Figure 11A:
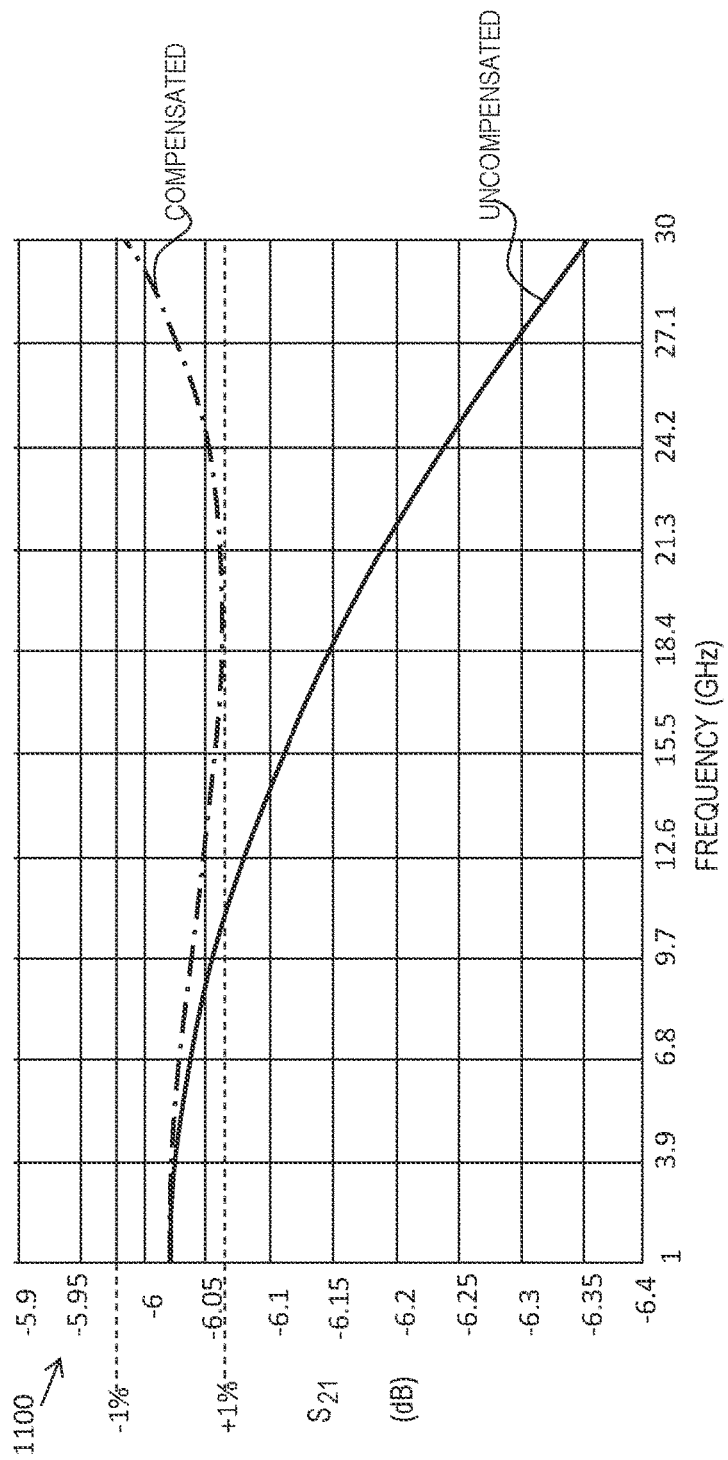
FIG. 11A is a graph of the transmission coefficient of a frequency compensated thin-film resistor in accordance with aspects of the presently disclosed subject matter.

FIG. 11A illustrates a graph 1100 showing compensation results obtained from an exemplary thin-film resistor constructed in accordance with the presently disclosed subject matter. Graph 1100 illustrates testing results for a compensated 100Ω resistor in accordance with aspects of the present disclosure in comparison with a similar uncompensated resistor. Transmission coefficient, $S_{21}$, is plotted on the vertical axis, and frequency is plotted on the horizontal axis. The uncompensated resistor exceeds a preferred ±1% deviation range at frequencies greater than about 10.5 GHZ. In contrast, the compensated resistor exhibits a transmission coefficient that remains within ±1% of the transmission coefficient of the compensated resistor at 1 GHz across the tested range of 1 to 30 GHz. In other words, the transmission coefficient of the compensated resistor may vary less than 1% over the tested frequency range, 1 to 30 GHz.

Figure 11B:
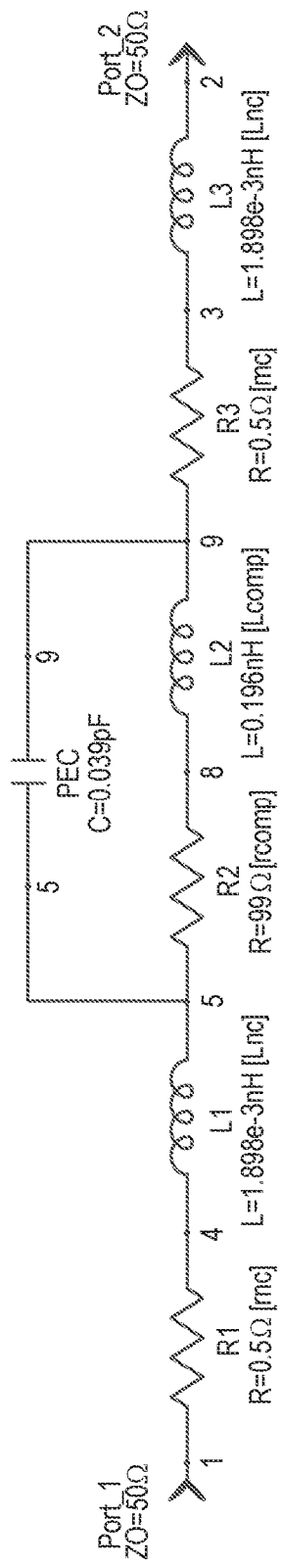
FIG. 11B is a schematic representation of an equivalent circuit of a frequency compensated thin-film resistor in accordance with aspects of the present disclosure.

FIG. 11B presents an equivalent circuit 630 for illustrating frequency compensation in accordance with aspects of the present disclosure. The equivalent circuit 630 includes several ideal resistors, inductors, and capacitor components. In equivalent circuit 630, a first resistor, R1, (e.g., 0.5Ω) and first inductor, L1, (e.g., $1.898 \times 10^{-3}$ nH), are connected in series with the first port and each of a compensating capacitor (e.g., 0.039 pF) and a second resistor, R2, (e.g., 99Ω) The compensating capacitor is in parallel with the second resistor, R2, and a second inductor, L2 (e.g., 0.196 nH). A third resistor, R3, (e.g., 0.5Ω) is connected in series with a third inductor, L3, (e.g., $1.898 \times 10^{-3}$ nH). Such equivalent circuit 630 would be most particularly representative of an appropriate equivalent circuit for the thin-film resistors 100, 200 discussed above with reference to FIGS. 5A and 5B, in which the frequency compensating layer is not in direct electrical contact with either of the contact pads 106, 108.

IV. Applications

The various embodiments of the surface mount component described herein may find application in any suitable type of electrical component. The surface mount component may find particular application in devices that receive, transmit, or otherwise employ high frequency radio signals. Example applications include devices adapted for 5G frequencies or associated instrumentation or equipment. Additional applications can include smartphones, signal repeaters (e.g., small cells), relay stations and radar.

Test Methods

The following section provides example methods for testing a surface-mount component to measure power capacity and area power capacity.

The power capacity of a thin-film resistor may be measured using a Keithley 2400 series Source Measure Unit (SMU), for example, a Keithley 2410-C SMU. The thin-film resistor may mounted to a printed circuit board such that the heat sink terminal is connected with a thermal via or other heat sink structure configured to dissipate thermal energy at a typical rate for printed circuit boards.

The thin-film resistor may be subjected to alternating current at a variety of frequencies and amplitudes. The temperature of the thin-film resistor may initially be typical room temperature (24.8° C.). An alternating current (root-mean-squared sinusoidal signal with a DC bias of 0.0 volts) may be applied at 28 GHZ and slowly increased in amplitude until the temperature of the thin-film resistor reaches 20° C. above the starting, ambient temperature. The temperature can be measured using a fluoroptic temperature sensor that is unaffected by RF emissions, such a Luxtron 812 fiber optic thermometer.

Using this method, a voltage can be determined at which the thin-film resistor remains in a steady state condition at 20° C. above room temperature. The corresponding power level may be defined as the power capacity of the thin-film component. This power capacity may be calculated using the measured current and voltage associated with the steady state condition at 20° C. above room temperature. For example, the dissipated power may be calculated by multiplying the applied current with the applied voltage.

The above procedure may be repeated using applied voltages of various frequencies to establish the power capacity of the thin-film component across a range of frequencies (e.g., about 20 GHz to about 40 GHz or higher). For example, the test may be repeated at 2 GHz intervals across the frequency range, (e.g., 20 GHz, 22 GHZ, 24 GHz . . . 40 GHz, or higher).

The area power capacity may be calculated by dividing the measured power capacity of the surface mount component by the area or footprint of the surface-mount component.

During an actual test of the surface mount component, the microstrips 1208 would be used to electrically connect a signal generator and testing apparatus, such as a Keithley 2400 series Source Measure Unit (SMU).

The following table presents a comparison of the simulation results for surface mount components including frequency compensated thin-film resistors and the simulation results for surface mount components that do not include frequency compensation structures. The surface mount components are generally configured as described above with reference to FIG. 1.

The resistance variation percentages indicate the resistance variation across a frequency range from DC to the listed frequency limit. For example, in the first row, a variation of 1% or less is produced from DC to 12.5 GHz for an uncompensated thin-film resistor. In comparison, a variation of 1% or less is maintained from DC up to 27.5 GHz for a compensated thin-film resistor. The length and width of the compensation structure for each simulation is also presented.

| Test Board Material | Test Board Thickness (mm) | Microstrip Line Width (mm) | Resistance Variation | Uncompensated Freq. Limit (GHz) | Compensated Freq. Limit (GHz) | Comp. Structure Length (μm) | Comp. Structure Width (μm) |
|---|---|---|---|---|---|---|---|
| Air | 0.130 | N/A | 1% | 12.5 | 27.5 | 50 | 150 |
|  |  |  | 5% | 29.5 | 45 | 60 | 150 |
|  |  |  | 10% | 39.5 | 50 | 60 | 140 |
|  |  |  | 15% | 46 | 57.5 | 60 | 220 |
| Alumina | 0.275 | 0.345 | 1% | 2 | 10 | 80 | 250 |
|  |  |  | 5% | 7.5 | 20 | 80 | 140 |
|  |  |  | 10% | 13 | 27.5 | 60 | 150 |
| Generic Test Board with Permittivity of 4.4 | 0.130 | 0.345 | 1% | 1.5 | 2.5 | 80 | 250 |
|  |  |  | 5% | 7 | 30 | 80 | 250 |
|  |  |  | 10% | 11.5 | 35 | 80 | 250 |
|  |  |  | 15% | 15.5 | 45 | 80 | 140 |
| Rogers 3003 | 0.130 | 0.345 | 1% | 4 | 10 | 70 | 200 |
|  |  |  | 5% | 13.5 | 30 | 60 | 150 |
|  |  |  | 10% | 58 | 60 | 40 | 210 |
|  |  |  | 15% | 60 | 62.5 | 50 | 150 |
| Rogers 4350 | 0.130 | 0.345 | 1% | 2.5 | 15 | 80 | 210 |
|  |  |  | 5% | 10 | 27.5 | 70 | 240 |
|  |  |  | 10% | 17 | 45 | 60 | 210 |
|  |  |  | 15% | 25.5 | 50 | 70 | 90 |

Examples

Computer modeling was used to simulate surface mount components according to aspects of the present disclosure. A testing board can be used to determine various characteristics of the surface mount component. The materials and dimensions of the testing board, however, have been found to influence the results and, therefore, were also simulated using computer modeling.

Figure 12:
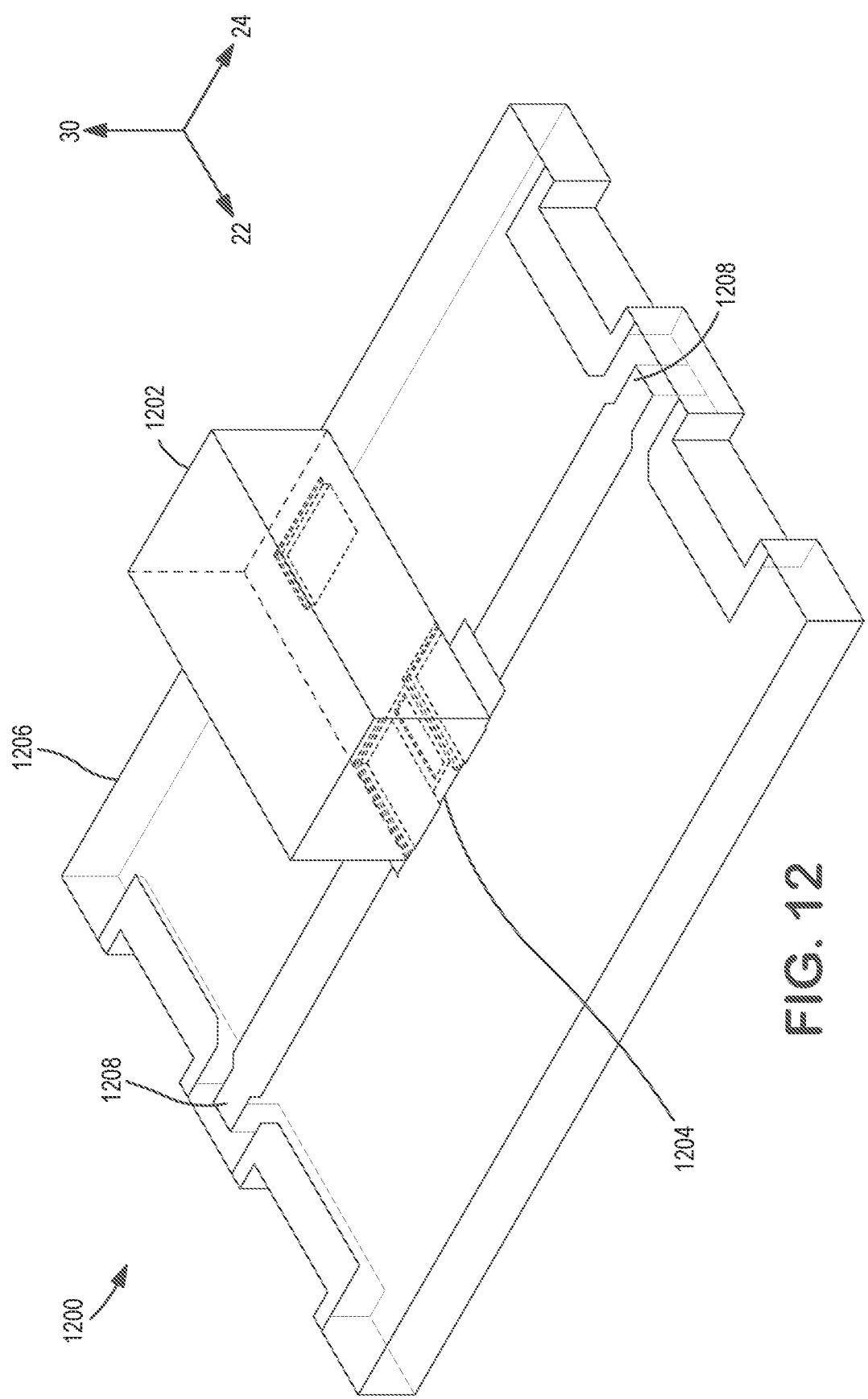
FIG. 12 is a perspective view of a computer model of a testing assembly for determining various characteristics of a surface mount component that includes a thin-film resistor in accordance with aspects of the present disclosure.

FIG. 12 illustrates a testing assembly 1200 that was simulated to determine various characteristics of the surface mount components. The testing assembly 1200 includes a surface mount component 1202 having a flip-chip configuration. The surface mount component 1202 includes a thin-film resistor 1204. The surface mount component 1202 is illustrated as transparent so that the thin-film resistor 1204 is visible. The surface mount component 1202 is mounted to a test board 1206 that includes a pair of microstrips 1208. The thin-film resistor 1204 is connected across the microstrips 1208 such that each terminal of the thin-film resistor 1204 is connected with a respective one of the microstrips 1208.

The above comparison illustrates that the surface mount components that include compensation structures exhibit resistances that vary less over larger frequency ranges. More specifically, the compensated thin-film resistors operate at higher frequencies with less resistance variation than thin-film resistors that lack such structures.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A surface mount component comprising:
an electrically insulating beam that is thermally conductive, the electrically insulating beam having a first end and a second end that is opposite the first end;

a thin-film component formed on the electrically insulating beam adjacent the first end of the electrically insulating beam; and
a heat sink terminal formed on the electrically insulating beam adjacent the second end of the electrically insulating beam,
wherein the thin-film component has an area power capacity greater than 2 W/mm² at a frequency of about 20 GHz or higher,
wherein the heat sink terminal has a centerline extending parallel to the second end of the electrically insulating beam, the centerline offset from the second end of the electrically insulating beam by a heat sink terminal offset distance,
wherein the surface mount component has an overall length from the first end to the second end of the electrically insulating beam,
wherein the overall length of the surface mount component is greater than about 0.1 mm and less than about 5 mm, and
wherein a ratio of the overall length to the heat sink terminal offset distance is about 2 or greater.

2. The surface mount component of claim 1, wherein the thin-film component comprises a first terminal and a second terminal, and wherein each of the first terminal, second terminal, and heat sink terminal are disposed on a first surface of the electrically insulating beam.

3. The surface mount component of claim 1, wherein the thin-film component comprises a first terminal and a second terminal, wherein the electrically insulating beam comprises a second surface that is opposite the first surface, and wherein at least one of the first terminal, second terminal, or heat sink terminal wraps around the electrically insulating beam such that at least a portion of the at least one of the first terminal, second terminal, or heat sink terminal is disposed on the second surface.

4. The surface mount component of claim 1, wherein the thin-film component comprises a first terminal and a second terminal, and wherein at least one of the first terminal, second terminal, or heat sink terminal is configured as a wrap-around terminal.

5. The surface mount component of claim 1, wherein the thin-film component is configured as a flip-chip component.

6. The surface mount component of claim 1, wherein the thin-film component has a transmission coefficient that varies less than about 20% across frequencies ranging from about 20 GHz to about 40 GHz.

7. The surface mount component of claim 1, wherein the thin-film component has a resistance that varies less than about 10% across frequencies ranging from about 20 GHz to about 40 GHz.

8. The surface mount component of claim 1, wherein the thin-film component comprises a first terminal, a second terminal, and a resistive layer connected between the first terminal and the second terminal.

9. The surface mount component of claim 1, wherein the electrically insulating beam comprises a material having a thermal conductivity from about 150 W/m·° C. to about 300 W/m·° C. at about 22° C.

10. The surface mount component of claim 1, wherein the electrically insulating beam comprises at least one of aluminum nitride or beryllium oxide.

11. The surface mount component of claim 1, wherein an overall width of the surface mount component is greater than about 0.05 mm and less than about 2.5 mm.

12. The surface mount component of claim 1, wherein an overall thickness of the surface mount component is greater than about 0.05 mm and less than about 2.5 mm.

13. A surface mount component comprising:
an electrically insulating beam that is thermally conductive; and
a thin-film component formed on the electrically insulating beam, the thin-film component including a first terminal, a second terminal, a resistive layer electrically connected between the first terminal and the second terminal, and a frequency compensating conductive layer formed over the resistive layer;
wherein the thin-film component has an area power capacity of greater than 2 W/mm² at a frequency of about 20 GHz or higher, and
wherein a thickness of the frequency compensating conductive layer ranges from about 0.01 μm to about 100 μm.

14. The surface mount component of claim 13, wherein the area power capacity of the thin-film component is less than about 10 W/mm² at about 28 GHz.

15. A surface mount component comprising:
an electrically insulating beam that is thermally conductive, the electrically insulating beam having a first end and a second end that is opposite the first end along an X direction;
a thin-film component formed on the electrically insulating beam adjacent the first end of the electrically insulating beam, the thin-film component including a first terminal, a second terminal, and a resistive layer electrically connected between the first terminal and the second terminal; and
a heat sink terminal formed on the electrically insulating beam adjacent the second end of the electrically insulating beam, the heat sink terminal has a centerline extending parallel to the second end of the electrically insulating beam, the centerline of the heat sink terminal offset from the second end of the electrically insulating beam along the X direction by a heat sink terminal offset distance,
wherein the electrically insulating beam comprises at least one of aluminum nitride or beryllium oxide,
wherein the thin-film component has an area power capacity greater than 2 W/mm² at a frequency of about 20 GHz or higher,
wherein the surface mount component has an overall length from the first end to the second end of the electrically insulating beam,
wherein the overall length of the surface mount component is greater than about 0.1 mm and less than about 5 mm, and
wherein a ratio of the overall length to the heat sink terminal offset distance is about 2 or greater.

16. The surface mount component of claim 15, wherein the thin-film component has a power capacity greater than 1 W at a temperature of about 44.8° C.

17. The surface mount component of claim 15, wherein the first terminal and the second terminal are offset from each of the first end and a pair of side surfaces of the electrically insulating beam, wherein the first terminal and the second terminal share a centerline extending parallel to the first end of the electrically insulating beam, wherein the centerline of the first terminal and the second terminal is offset from the first end of the electrically insulating beam by a thin-film terminal offset distance, and wherein a ratio of the overall length to the thin-film terminal offset distance is about 2 or greater.

\* \* \* \* \*